(12) United States Patent
Johnson et al.

(10) Patent No.: US 7,519,880 B1
(45) Date of Patent: Apr. 14, 2009

(54) BURN-IN USING SYSTEM-LEVEL TEST HARDWARE

(75) Inventors: Trent William Johnson, Austin, TX (US); Steven Russell Klassen, Buda, TX (US); Jeff Brinkley, Georgetown, TX (US); Glenn Eubank, Austin, TX (US); John Heon Yi, Austin, TX (US); Satwant Singh, San Jose, CA (US); Michael Gregory Tarin, Austin, TX (US); Chandrakant Pandya, Pflugerville, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 151 days.

(21) Appl. No.: 11/174,823

(22) Filed: Jul. 5, 2005

(51) Int. Cl.
*G01R 31/28* (2006.01)

(52) U.S. Cl. .................... 714/724; 714/718; 714/721; 714/726; 714/727; 714/728; 714/729; 714/731; 714/744

(58) Field of Classification Search ........................ None
See application file for complete search history.

(56) References Cited

U.S. PATENT DOCUMENTS

| | | | |
|---|---|---|---|
| 5,982,189 A * | 11/1999 | Motika et al. ............... 324/763 |
| 6,055,657 A * | 4/2000 | Heo et al. .................... 714/724 |
| 6,081,864 A | 6/2000 | Lowe et al. |
| 6,329,831 B1 * | 12/2001 | Bui et al. .................... 324/765 |
| 6,392,432 B1 * | 5/2002 | Jaimsomporn et al. ...... 324/760 |
| 6,407,567 B1 * | 6/2002 | Etter ........................... 324/760 |
| 6,509,202 B1 * | 1/2003 | Kim .............................. 438/17 |
| 6,888,363 B1 | 5/2005 | Bolde et al. |
| 6,900,650 B1 | 5/2005 | Sheng et al. |
| 7,103,495 B2 * | 9/2006 | Kiryu .......................... 702/117 |
| 2002/0121913 A1 * | 9/2002 | Miller et al. ................ 324/760 |
| 2005/0193284 A1 * | 9/2005 | Yasuo .......................... 714/48 |

* cited by examiner

*Primary Examiner*—Cynthia Britt
*Assistant Examiner*—Guerrier Merant
(74) *Attorney, Agent, or Firm*—Meyertons Hood Kivlin Kowert & Goetzel, P.C.; Rory D. Rankin

(57) ABSTRACT

A burn-in test system. A burn-in test system includes a device under test (DUT), a temperature controller coupled to the DUT, and a test controller. During testing, the test controller: (a) sets a parameter of the DUT to a first value and applies a test stimulus to the DUT, and (b) sets the parameter of the DUT to a second value and applies the test stimulus to the DUT. A change in the value of the parameter results in a change in the amount of heat dissipated by the DUT. The temperature controller maintains the DUT at a pre-determined temperature during testing with the parameter set to both the first and the second values. The DUT may be further coupled to a module that comprises circuitry employed in a product-level application environment. The module is configured by the test controller to simulate a product-level application.

18 Claims, 5 Drawing Sheets

BURN-IN USING SYSTEM-LEVEL TEST HARDWARE

BACKGROUND OF THE INVENTION

1. Field of the Invention

This invention relates to integrated circuit (IC) test systems and, more particularly, to burn-in and system testing of ICs.

2. Description of the Related Art

Complex integrated circuits (ICs) such as microprocessors are routinely subjected to several tests to screen for defective parts and to characterize the speed and voltage at which they will operate in target applications. One such test that is frequently employed is a "burn-in" test whose purpose is to weed out defective parts that would otherwise fail early in their operating use. Burn-in tests are usually performed on 100% of manufactured parts with the goal of accelerating potential failure mechanisms, thereby screening out any defective parts. In order to accelerate potential failure mechanisms, burn-in testing may operate parts at higher than normal voltages and/or temperatures, with temperatures being controlled by placing parts in an oven-like enclosure, providing cooling via fans or liquid heat exchange mechanisms, etc. A technique referred to as "self-heating" is often employed in which the operating temperature is a function of the clock speed at which a device under test (DUT) is operated during the burn-in test.

Additional testing is usually performed to verify the functionality and characterize the operating speed of a DUT. Well-known functionality tests include cache execution, scan, built-in self test (BIST), logic built-in self test (LBIST), and system-level application tests. Generally speaking functionality tests are performed under normal environmental conditions, i.e. at normal operating voltages and temperatures. By performing one or more functional tests at a variety of clock speeds, the maximum operating speed for a given part may be determined. Parts are often given a speed rating and separated into different lots according to the measured maximum speed.

Because of the different goals of burn-in tests and functional tests, different test systems have evolved to perform each type of test. Burn-in test equipment usually involves operating a part in an extreme environment while the DUT executes fairly simple instructions. Functional testing, on the other hand, generally involves causing a DUT to execute complex instructions in an environment that resembles a product-level application at a number of pre-determined clock speeds. For example, system-level testing is often performed by inserting a processor DUT into a test fixture that is functionally similar to a computer motherboard, loading an operating system into the processor's memory, and executing system-level application software. Consequently, execution of burn-in and functional tests often requires that a DUT be inserted into each of two or more test fixtures sequentially, resulting in higher risk of damage as well as extending the time to complete all of the tests in the sequence.

The fact that burn-in tests are often performed in a circuit environment that differs from a product-level application may lead to both higher stress to some parts of a device as well as lower stress to other parts than might occur in most applications, causing both lower yield and higher early failure than might otherwise be achieved. In addition to the above problems inherent in separate burn-in and functional test systems, the use of self-heating causes an undesirable dependency between the pattern of instructions that are executed during a test and the operating temperature of the device under test. Also, because of rapid changes in product-level functionality, it is difficult for test systems to be kept current with product-level applications.

SUMMARY OF THE INVENTION

Various embodiments of a burn-in test system are contemplated. A burn-in test system includes a device under test (DUT), a temperature controller coupled to the DUT, and a test controller. During testing, the test controller is configured to: (a) set a parameter of the DUT to a first value and apply a test stimulus to the DUT, and (b) set the parameter of the DUT to a second value and apply the test stimulus to the DUT. A change in the value of the parameter results in a change in the amount of heat dissipated by the DUT. The temperature controller is configured to maintain the DUT at a pre-determined temperature during testing with the parameter set to both the first and the second values.

In one embodiment, the DUT is coupled to a module that comprises circuitry employed in a product-level application environment. The module is configured by the test controller to simulate a product-level application. During at least a portion of testing, the test stimulus includes causing the DUT to execute one or more of: a system-level application, a scan test, a built-in self-test (BIST), a logic built-in self-test (LBIST), and a cache execution test.

Figure 1:
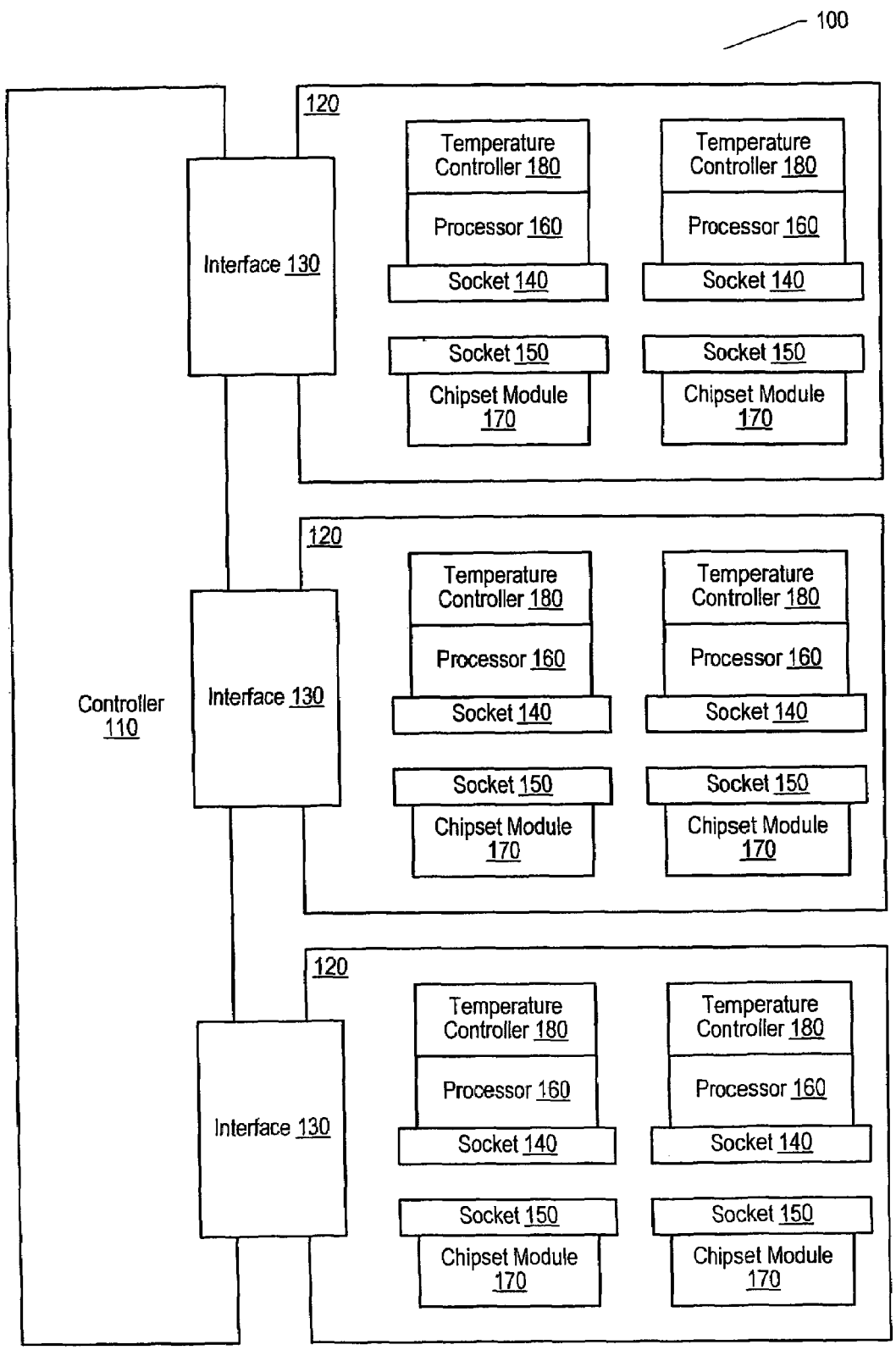
FIG. 1 illustrates one embodiment of a test system for performing both burn-in and system-level testing.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 illustrates one embodiment of a test system 100 for performing both burn-in and system-level testing. In the illustrated embodiment, a controller 110 is coupled to three device modules 120 via interfaces 130. As shown, each device module 120 includes two sockets 140 and two sockets 150. Socket 140 couples a DUT 160 to device module 120. Socket 150 couples a chipset module 170 to device module 120. DUT 160 is further coupled to a Temperature Controller 180. The number of DUTs 160 and chipset modules 170 that may be coupled to a device module 120 may vary from embodiment to embodiment, depending on physical packaging constraints and the number of simultaneous tests that are desired. Regardless of the number of DUTs 160 on a device module 120, in these embodiments each DUT 160 may be associated with an individual chipset module 170 and an individual temperature controller 180. In addition, in other embodiments, controller 110 may be coupled to more than or less than three device modules 120, depending on physical packaging constraints and the number of simultaneous tests that are desired.

In one embodiment, controller 110 may be a control computer including a general-purpose processor coupled to a set of standard input/output devices. Alternatively, controller 110 may be implemented in custom logic circuitry. In other embodiments, controller 110 may be a combination of custom logic, general-purpose hardware, software, and/or firmware generally suited for controlling test equipment. In one embodiment, controller 110 may be further coupled to a remote computer system from which it may receive test programs and to which it may send test results for analysis as described below.

In one embodiment, chipset module 170 may include the support chips typically comprising a computer motherboard. For example, chipset module 170 may comprise RAM, PROM, input/output devices, etc to simulate the product-level circuit environment of a motherboard. As, described above, chipset module 170 may be coupled to a socket 150. Hence, chipset module 170 may be easily replaced for repair or upgrade without requiring a replacement of larger portions of test system 100. In alternative embodiments, one or more chipsets 170 may be incorporated into device module 120 without the use of sockets 150.

Temperature controller 180 may comprise a heating element, a cooling fan, a thermoelectric cooler (TEC) in contact with DUT 160, a liquid circulating heat sink in contact with DUT 160, or a combination of the above. In one embodiment, temperature controller 180 is a TEC that may be configured to heat or cool DUT 160, depending on the amount of self-heating produced by a test being executed and the desired operating temperature. Temperature controller 180 may also include a temperature sensor to facilitate active temperature control.

During testing, controller 110 may configure temperature controller 180 to achieve a desired operating temperature and maintain that temperature actively throughout the duration of a test. Controller 110 may also configure chipset module 170 to simulate the circuit environment of a product-level application. In addition, controller 110 may load a set of instructions into DUT 160 to be executed during a test. During testing and at the conclusion of a test, controller 110 may, in various embodiments, retrieve a set of test results from DUT 160 and/or chipset 170. Also, controller 110 may monitor the testing process and store a record of any system failures that occur. In embodiments in which controller 110 is not coupled to a remote computer system, controller 110 may include a storage device for storing test results for future analysis. Controller 110 may, in such embodiments, also perform analysis of test results and present results to a user. Alternatively, in some embodiments, controller 110 may transmit test results to a remote computer system for storage, analysis, and presentation.

Figure 2:
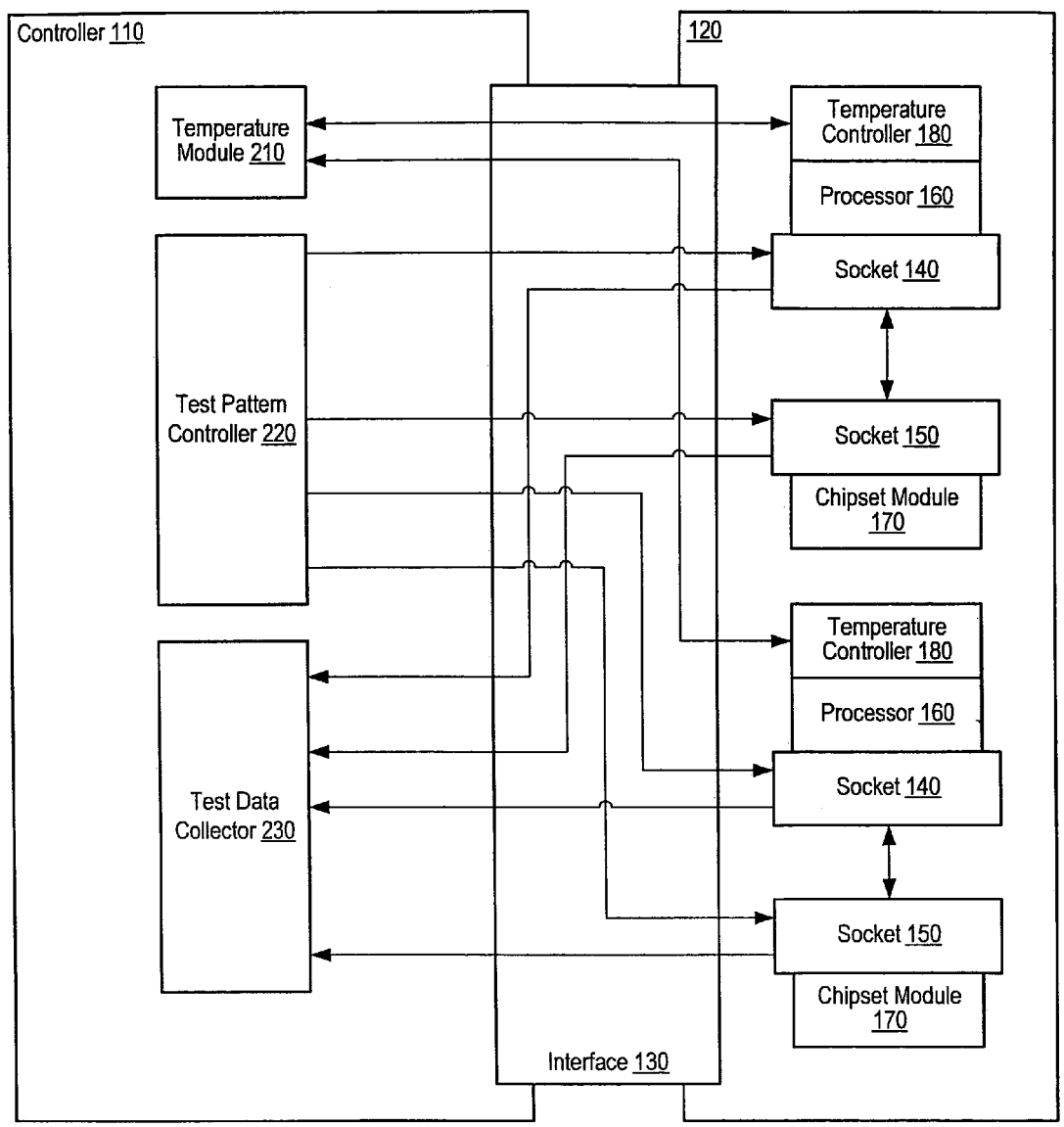
FIG. 2 illustrates one embodiment of the connections between a controller and a device module.

FIG. 2 illustrates one embodiment of the connections between controller 110 and a device module 120 through interface 130. In the illustrated embodiment, controller 110 includes a temperature module 210, a test pattern controller 220, and a test data collector 230. In alternative embodiments controller 110 may include more than one of each of temperature module 210, test pattern controller 220, and test data collector 230, which in turn may be coupled to one, two, or more DUT/chipset module/temperature controller combinations.

During operation, temperature module 210 may send a temperature setpoint command to temperature controllers 180 in order to set the temperature of one or more DUTs 160. For example, temperature controller 180 may control a voltage applied to a heating element coupled to DUT 160 and/or control the flow of a refrigerating liquid in close proximity to DUT 160. In addition, temperature controller 180 may include a temperature sensor for measuring the temperature of DUT 160. By measuring the output of the temperature sensor and actively heating or cooling DUT 160, temperature controller 180 may implement an active temperature control loop.

Prior to the start of a burn-in test, test pattern controller 220 may configure DUT 160 and chipset module 170 for a test. For example, test pattern controller 220 may download a set of instructions to an onboard instruction cache within DUT 160 and/or to RAM within chipset module 170 to be executed by DUT 160 during a test. Alternatively, test pattern controller 220 may transmit a sequence of signals to the pins of DUT 160 during a test, causing DUT 160 to execute a BIST, LBIST, scan test, or other test as desired.

During a test, in one embodiment, test data collector 230 may monitor DUT 160 and chipset module 170, retrieving failure data and test results and storing them locally for analysis and presentation. In an alternative embodiment, test data collector 230 may convey test results to a remote computer system for analysis and presentation. In addition, in some embodiments, test data collector 230 may batch a set of test results during testing and retrieve them from DUT 160 and/or chipset module 170 at the conclusion of the burn-in test.

Figure 3:
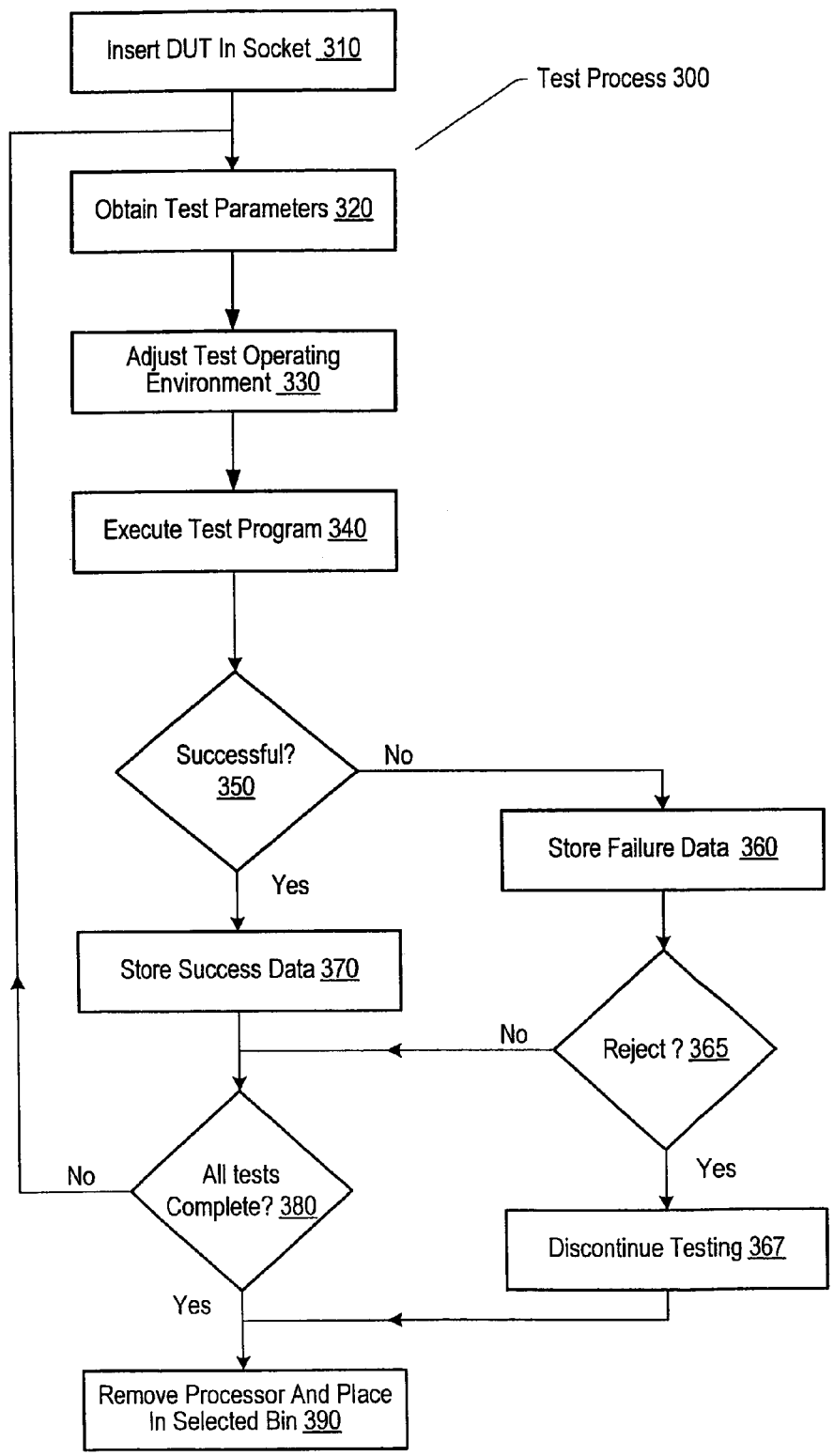
FIG. 3 illustrates one embodiment of a test process that may be executed by a controller to test a device.

FIG. 3 illustrates one embodiment of a test process 300 that may be executed by controller 110 to test DUT 160. An operator may begin the setup phase of the test process by inserting DUT 160 into socket 140 (block 310). Controller 110 may then obtain the parameters of a test (block 320). In one embodiment, controller 110 may obtain the parameters of a test from an operator input. Alternatively, controller 110 may obtain the parameters of a test from a remote computer system. To complete the setup phase of the test, controller 110 may adjust the test operating environment (block 330). In particular, controller 110 may set the operating temperature via temperature module 210 and temperature controller 180. Other environmental parameters that may be set by controller 110 include the DUT operating voltage and clock speed.

Once the setup phase of the test process is complete, controller 110 may execute a selected test program (block 340). In one embodiment, the selected test comprises a burn-in test in which a stimulus may be applied to DUT 160 by controller 110. For example, the stimulus may include clocking DUT 160 at a pre-determined clock speed and causing DUT 160 to execute one or more of a BIST, LBIST, scan, cache execution, or system-level application test for a pre-determined period of time. DUT 160 may execute instructions that are stored in memory within chipset module 170 and/or internal to the DUT. In other embodiments, various combinations of a BIST, LBIST, scan, cache execution, system-level application test, or other stimulus may be applied to DUT 160 as a functional test apart from a burn-in test. In alternative embodiments, a burn-in test may include any other suitable stimulus that may accelerate potential failure mechanisms in DUT 160.

During test execution and/or at the conclusion of test execution, controller 110 may monitor the success or failure of the test in decision block 350. For example, controller 110 may retrieve test results from either DUT 160 or chipset module 170. If a failure is detected, controller 110 may store failure data (block 360) either locally or by transmitting a test dataset to a remote computer system. In one embodiment, if a burn-in failure is detected, DUT 160 may be rejected (decision block 365) and testing of DUT 160 may be discontinued (block 367). DUT 160 may then be removed from its socket 140 and placed in a reject bin (block 390). Alternatively, if DUT 160 fails to operate at a pre-determined clock speed during a speed test, then a decision may be made (decision block 365) to test at a lower speed. Controller 110 may then check to see if another test is available (decision block 380) for DUT 160.

If a test is successful (decision block 350), controller 110 may store success data associated with DUT 160 and execute decision block 380 to see if additional testing or DUT 160 is desired. If so, controller 110 may return to block 320. If not, controller 110 may signal an operator to remove DUT 160 from its socket 140 and place it in a selected sort bin (block 390).

Figure 4:
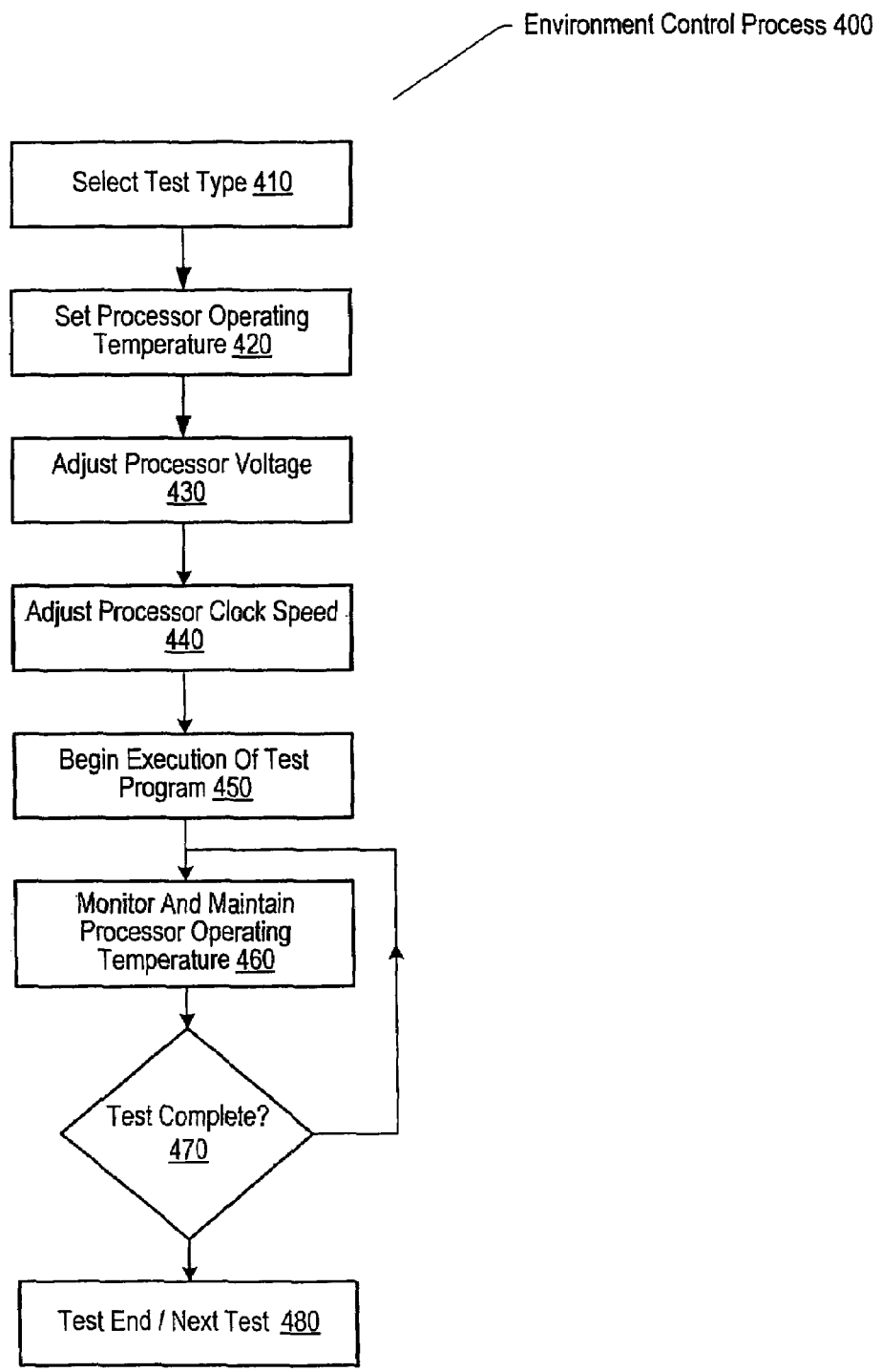
FIG. 4 illustrates one embodiment of a process for controlling the environment of a burn-in test that may be executed by a controller.

FIG. 4 illustrates one embodiment of a process 400 for controlling the environment of a burn-in test that may be executed by controller 110. To begin the process, controller 110 may select the type of test to be performed in block 410. Generally speaking, the operating temperature is set at the beginning of a burn-in test to allow sufficient time for temperature to stabilize. Controller 110 may set the operating temperature in block 420. Then, controller 110 may adjust the operating voltage (block 430) and operating clock speed (block 440). In one embodiment, a delay may be added to block 440 to allow the DUT operating environment to stabilize. Once the desired temperature, voltage, and clock speed have been reached, controller 110 may cause DUT 160 to begin the execution of a test program in block 450. During the test execution, controller 110 may enter a control loop in which the DUT operating temperature is monitored and maintained (block 460), looping back to continue to actively control the operating temperature until the test is complete (decision block 470). At the conclusion of the test, controller 110 may end the test or proceed to execute another test on DUT 160 (block 480).

Figure 5:
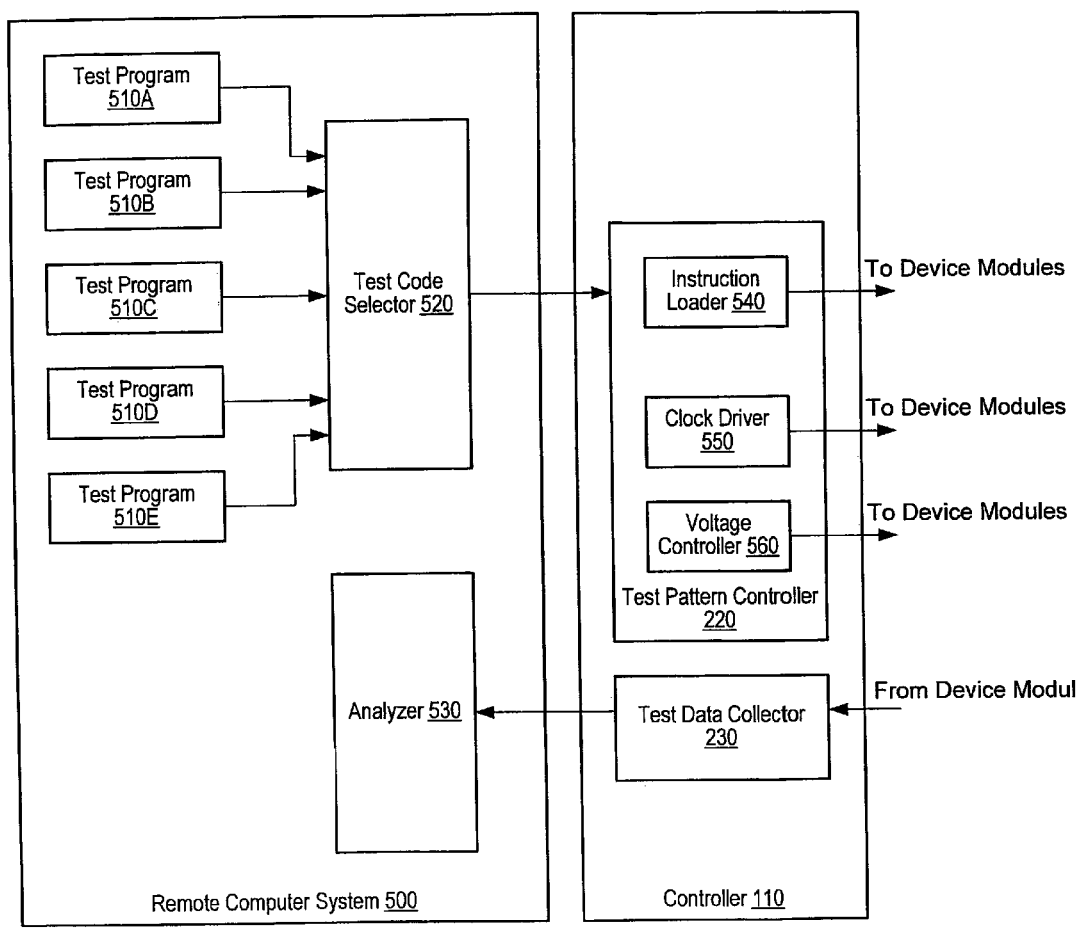
FIG. 5 illustrates one embodiment of a remote computer system coupled to a controller of a test system.

FIG. 5 illustrates one embodiment of a remote computer system 500 coupled to controller 110 of a test system. In the illustrated embodiment, remote computer system 500 may include test programs 510A-510E. Remote computer system 500 may also include a test selector 520 and an analyzer 530. As shown, test pattern controller 220 within controller 110 may include an instruction loader 540, a clock driver 550, and a voltage controller 560.

During operation, test selector 520 may respond to an operator input or other command by selecting one or more of test programs 510A-510E. A test program 510 may include a set of temperature, voltage, and clock speed settings as well as a set of instructions to be executed by a DUT. Other test parameters such as test duration, success criteria, etc. may be included in a test program 510. Test selector 520 may be further configured to convey a test program 510 to test pattern controller 220 of controller 110 which, in turn may configure DUT 160 and chipset module 170 for the selected test. Within test pattern controller 220, instruction loader 540 may be configured to convey executable instructions to DUT 160 and/or chipset 170. Clock driver 550 may be configured to deliver a system clock to DUT 160 at a clock speed determined by test program 510. In addition, voltage controller 560 may be configured to apply a supply voltage to DUT 160 as determined by test program 510.

During and/or at the conclusion of a burn-in test, test results may be retrieved by test data collector 230. In the illustrated embodiment, test data collector 230 may convey retrieved test results to analyzer 530 for analysis and/or presentation to a test operator. It is noted that in alternative embodiments, at least some of the functionality of remote computer system 500 may be incorporated into controller 110.

In one embodiment, remote computer system 500 may control one test system 100. In other embodiments, remote computer system 500 may control several test systems 100 stacked together in one or more equipment racks. Remote computer system 500 may include a user interface such as a keyboard and mouse, a touch-screen, a display etc. Remote computer system 500 may be a PC, workstation, or any other computing device suitable for directing and monitoring a test system.

It is noted that the above described embodiments may comprise software. In such an embodiment, the program instructions which implement the methods and/or mechanisms may be conveyed or stored on a computer accessible medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Still other forms of media configured to convey program instructions for access by a computing device include terrestrial and non-terrestrial communication links such as network, wireless, and satellite links on which electrical, electromagnetic, optical, or digital signals may be conveyed. Thus, various embodiments may further include receiving, sending or storing instructions and/or data implemented in accordance with the foregoing description upon a computer accessible medium.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A burn-in test system comprising:
   a device under test (DUT);
   a temperature controller coupled to the DUT;
   a test controller configured to:
      set a parameter of the DUT to a first value and apply a test stimulus to the DUT;
      set the parameter of the DUT to a second value and apply the test stimulus to the DUT;
   wherein the parameter is clock speed, a change in the value of the parameter results in a change in the amount of heat dissipated by the DUT, and the parameter is not used to control the temperature of the DUT;
   wherein the temperature controller is configured to maintain the DUT at a pre-determined temperature during testing with the parameter set to both the first and the second values by heating the DUT;
   wherein if setting the parameter to the second value causes an increase in the heat dissipation within the DUT, the temperature controller is configured to reduce heating of the DUT in response in order to maintain the DUT at the pre-determined temperature; and
   wherein if setting the parameter to the second value causes a decrease in the heat dissipation within the DUT, the temperature controller is configured to increase heating of the DUT in response in order to maintain the DUT at the pre-determined temperature.

2. The system of claim 1, further comprising a module coupled to the DUT that comprises circuitry employed in a product-level application environment, wherein the module is configured by the test controller to simulate a product-level application.

3. The system of claim 2, wherein the test stimulus includes causing the DUT to execute a system-level application during at least a portion of a burn-in test.

4. The system of claim 3, wherein the burn-in test includes a system-level speed test.

5. The system of claim 4, wherein the DUT is a sample of a type of device designed to operate at a speed that ranges between a minimum speed and a maximum speed, and wherein the first parameter value is the minimum speed and the second parameter value is the maximum speed.

6. The system of claim 5,
wherein the test controller is further configured to repeatedly vary the value of the clock speed until:
at least one test success and at least one test failure are obtained; or
a test success is obtained at a designated maximum speed; and
wherein a set of test results is analyzed to determine the maximum speed at which the DUT operated successfully.

7. The system of claim 1, wherein the parameter further comprises
operating voltage; and
wherein the clock speed is not used to control the temperature of the DUT.

8. The system of claim 1, wherein the test stimulus comprises causing the DUT to execute one or more of a scan test, a built-in self-test (BIST), a logic built-in self-test (LBIST), and a cache execution test, during at least a portion of the burn-in test.

9. The system of claim 1,
wherein the test controller is configured to test at least two DUTs concurrently; and
wherein each DUT is coupled to an individual temperature controller.

10. A burn-in test method comprising:
setting a parameter of the DUT to a first value and applying a test stimulus to the DUT;
setting the parameter of the DUT to a second value and applying the test stimulus to the DUT;
maintaining a device under test (DUT) at a pre-determined temperature during testing with the parameter set to both the first and the second values by heating the DUT;
wherein the test stimulus comprises a source of heat dissipation in the DUT;
wherein the parameter is clock speed, a change in the value of the parameter results in a change in the amount of heat dissipated by the DUT, and the parameter is not used to control the temperature of the DUT;
wherein if setting the parameter to the second value causes an increase in the heat dissipation within the DUT, the temperature controller is configured to reduce heating of the DUT in response in order to maintain the DUT at the pre-determined temperature; and
wherein if setting the parameter to the second value causes a decrease in the heat dissipation within the DUT, the temperature controller is configured to increase heating of the DUT in response in order to maintain the DUT at the pre-determined temperature.

11. The method of claim 10, further comprising coupling the DUT to a module comprising circuitry employed in a product-level application environment and configured to simulate a product-level application.

12. The method of claim 11, wherein the test stimulus includes causing the DUT to execute a system-level application during at least a portion of a burn-in test.

13. The method of claim 12,
wherein the burn-in test includes a system-level speed test.

14. The method of claim 13, wherein the DUT is a sample of a type of device designed to operate at a speed that ranges between a minimum speed and a maximum speed, and wherein the first parameter value is the minimum speed and the second parameter value is the maximum speed.

15. The method of claim 14, further comprising:
repeatedly varying the value of the clock speed until:
at least one test success and at least one test failure are obtained; or
a test success is obtained at a designated maximum speed; and
analyzing a set of test results to determine the maximum speed at which the DUT operated successfully.

16. The method of claim 10, wherein the parameter further comprises
operating voltage; and
wherein the clock speed is not used to control the temperature of the DUT.

17. The method of claim 10, wherein the test stimulus comprises causing the DUT to execute one or more of a scan test, a built-in self-test (BIST), a logic built-in self-test (LBIST), and a cache execution test, during at least a portion of the test period.

18. The method of claim 10, further comprising:
testing at least two DUTs concurrently; and
controlling the temperature of each DUT independently.

* * * * *